United States Patent [19]

Privas

[11] 3,839,876

[45] Oct. 8, 1974

[54] MEANS FOR COLD PRODUCTION

[75] Inventor: Yves Emile Privas, Killowen-Blarney, Ireland

[73] Assignee: International Promotion Engineering S.A., Madrid, Spain

[22] Filed: Nov. 21, 1972

[21] Appl. No.: 308,326

[52] U.S. Cl. .......................................... 62/3, 62/457
[51] Int. Cl. .......................................... F25b 21/02
[58] Field of Search .......................................... 62/3

[56] References Cited

UNITED STATES PATENTS

| | | | |
|---|---|---|---|
| 2,959,018 | 11/1960 | Hivang | 62/3 |
| 2,991,628 | 7/1961 | Tuck | 62/3 |
| 3,004,393 | 10/1961 | Alseng | 62/3 |
| 3,019,609 | 2/1962 | Pietsch | 62/3 |
| 3,040,538 | 6/1962 | Alseng | 62/3 |
| 3,077,080 | 2/1963 | Pietsch | 62/3 |
| 3,085,405 | 4/1963 | Frantti | 62/3 |
| 3,138,934 | 6/1964 | Roane | 62/3 |
| 3,194,024 | 7/1965 | Bassett | 62/3 |
| 3,392,535 | 7/1968 | Castelet | 62/3 |

*Primary Examiner*—William J. Wye
*Attorney, Agent, or Firm*—Schuyler, Birch, Swindler, McKie & Beckett

[57] ABSTRACT

Means for cold production by a Peltier effect thermoelectric component and cooling of the hot face of this component by an air current sweeping the thermal exchange surfaces in a thermal conductivity relationship with said face, wherein said thermal exchange components have a small mass and are arranged so that the air path sweeping them is radial, i.e., centripetal or centrifugal, with respect to the center of this component at least in the part thereof located against the Peltier effect generating components.

8 Claims, 19 Drawing Figures

MEANS FOR COLD PRODUCTION

This invention relates to the improvement of cold production, by improving the means used to provide thermal exchanges with at least one of the hot and cold faces of a thermo-electric component generating, through the Peltier effect, a difference in temperature between its two faces. By the condensed term "thermo-electric component," is meant herein both what is commonly known as "thermo-element" and a unit comprising a group of several thermo-elements electrically connected with one another in any way. Usually, the cooling of a thermo-element is effected through circulation of a fluid which is caused to flow in contact with conducting blades in a thermal conductivity relationship with the hot face of the thermo-element. When a liquid fluid is used to cool this hot face, it is necessary subsequently to cool the latter if it is to be circulated in a closed circuit or to employ large quantities of liquid if the process is carried out in an open circuit; it is then possible to obtain efficient cooling and subsequently, a satisfactory efficiency of the thermo-element, but these cooling means, as a whole, are cumbersome; furthermore, a sufficient mass of liquid is not always available and certain applications even completely exclude this method of cooling; this is the case, in particular, for small portable appliances. Attempts are then made to use a gaseous fluid, air, in particular, but the latter being a poor cooler, use has to be made of bulky and heavy blade radiators; in spite of this, the cooling of the hot face of the thermo-element becomes highly insufficient after several minutes of operation which greatly decreases the efficiency of the thermo-element. All these reasons substantially limit the practical applications of thermo-elements by making a large number of them impossible.

The primary object of this invention is to improve this situation, thus increasing the field of application of Peltier effect thermo-elements and making it possible to provide new devices.

The basic characteristic of the invention is that the thermal exchange components between the hot face of the Peltier effect thermo-electric component and the cooling air have a small mass and are arranged so that the path of the air which sweeps them is centripetal or centrifugal with respect to the center of this unit, at least, in that part of them located against the Peltier effect generating components. This method of causing the cooling air to circulate offers various advantages, in particular, that of making it possible, for certain given sizes of the thermo-electric component, to increase the air output for a given flow rate with respect to a circulation which would sweep it in a single direction, from one side to the other. In addition, each half of the entire air output is used to cool only one half of the thermo-electric unit, whereas, usually, the entire air output is used successively for the cooling of both halves of the thermo-element, the second half of which is then cooled under poor conditions by air which has already been warmed. Furthermore, the length of the air path during thermal exchanges is reduced, which results in a decrease in frictional losses against the walls and through viscous friction in the boundary layer, and therefore in the heating up of the air through these friction phenomena.

In a preferred embodiment of this basic arrangement, said thermal exchange components consist of numerous thin blades arranged edgewise against the thermo-electric component, around the latter's central part, in a way similar to radial blades or paddles against the flange of a ventilator or turbine impeller.

This embodiment, and this constitutes a characteristic and important development of it through its consequences, makes it possible to provide a rotating apparatus comprising the thermo-electric unit and its thermal exchange surfaces and to drive it into rapid rotation through an appropriate motor member, preferably co-axial with this rotating apparatus, the thermo-electric component being then fed by a ring and friction device.

The improvements described above provide for small, compact, highly efficient cold generating units which may be used in various devices in which cold is used, mainly appliances for household use, for example: freezers, air-conditioners, refrigerators for the preservation of perishable goods, equipment for the temperature conditioning of liquids, in particular, drinks or of solid or pasty substances, etc.

As examples which are in no way limiting, the appended drawing shows several embodiments of cold production means according to the invention and of various devices which may be derived from them.

In this drawing.

In the example of the embodiment shown in FIGS. 1 to 6, the apparatus comprises a Peltier effect thermoelectric couple 1 shaped rectangularly on the hot face of which is applied the central part of a cooling plate 2 which constitutes the bottom of a part shaped as a cylindrical sleeve, indicated, as a whole, by 3, whose wall has deep grooves, parallel to the axis, some, 4, inside the sleeve, and the others, 5, alternating with the preceding ones, outside the sleeve, the lateral surface of which is thus shaped as a corrugated skirt.

Figures 1, 2, 3:
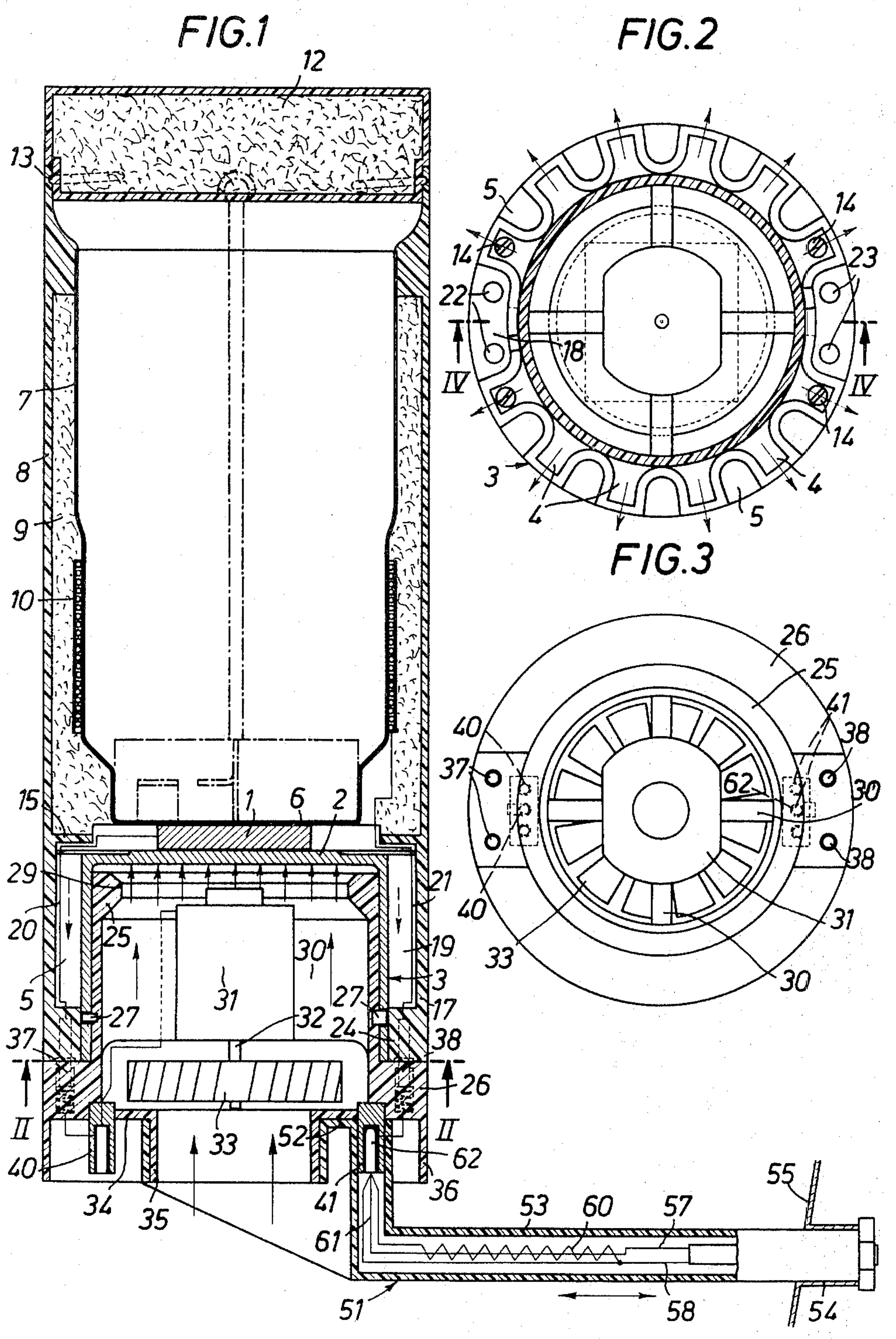
FIG. 1 is a vertical section through the axis, of an apparatus with an incorporated cup and of a device for mounting it on the dashboard of an automobile.
FIG. 2 is a cross-sectional view along line II—II of FIG. 1.
FIG. 3 shows, separately, as a plan view, the removable unit which groups the motor and air propelling component.

On the opposite cold face of thermocouple 1, is applied bottom 6 of a cylindrical cup 7 made of metal, in this case, aluminum, surrounded at a distance by a molded plastic case 8, a good thermal insulator 9, for example, polyurethane foam, being interposed. Near its bottom, the diameter of cup 7 is less than in the higher part thereof, so as to make it possible to increase the thickness of insulator 9 in the coldest zone, as shown in FIG. 1. The middle part of the cup has an intermediate diameter and is surrounded with an electric resistance 10 in intimate thermal conductivity contact with it. The rim of the cup bears against a small shoulder 11 of case 2 whose upper end is closed by an insulating cover-plug 12 which fits into it and becomes attached to it through a bayonet joint 13. The bottom of the cup has a diameter equal to the large diagonal of the rectangular thermo-element 1 which is thus completely covered.

Sleeve 3, thermo-element 1, cup 7 and case 8 are maintained in assembly with one another coaxially with screws 14 which cross bottom 2 of the sleeve at its periphery (FIG. 2) and are screwed into an interior circular shoulder 15 of case 8 (FIG. 1), silicone grease being interposed between the bottom of the cup and sleeve 3 in order to ensure good thermal conductivity.

Beyond the assembly plane, case 8, which has a diameter equal to that of sleeve 3, extends through two opposite lugs 17 which fit into large external grooves 18 of sleeve 3 by leaving between them and the latter a recess 19 in order to allow passage of electric wires 20 and 21 which go respectively to the thermo-element 1 and resistance 10 and end up, furthermore, on flush contact studs 22, 23 embedded within an internal edge 24, of each of these lugs 17.

At the base of case 8, under lugs 17 and sleeve 3, is removably attached a unit constituted as follows: a central cylindrical sleeve 25 is supported by an overlapping annular base 26 which is concentric with it and it fits into skirt 3 to which it is attached by a bayonet joint consisting of radial pins 27, having different diameters, taken at the molding into the material comprising the wall of sleeve 25 and which mesh with bent grooves 28 (FIGS. 5 and 6) of skirt 3, arranged so that the end of sleeve 25 is located at a short distance of the internal face of bottom 2 of sleeve 3, extra thicknesses, or bosses, 26*a* (FIGS. 5 and 6) then bearing against the underpart of lugs 17. At that end, the interior of the sleeve grows increasingly smaller due to an internal circular shoulder 29. Inside sleeve 25, extend, over a part of its diameter, from the wall, four radial divisions 30 arranged as a cross between which is housed a small electric motor 31 the axis of which is directed on the side opposite bottom 2 and carries an air propelling unit 33, which in this case is a flash wheel. The annular base 26 comprises as annular rim 34 directed towards the inside and carrying an external central neck 35 which is surrounded at a distance by a small hollow cylindrical socket 36 supported by base 26.

In the overlapping part of base 26, which is located opposite the ends of lugs 17, are housed spring contact studs 37, 38 (FIG. 5) which are plumb with flush contact studs 22, 23 when pins 27 are located at the ends of grooves 28 and are then applied elastically against the latter, thus providing the electrical connections and locking the assembly comprising sleeve 25 and case 8. Contact studs 37, of which there are two, arranged side by side (FIG. 3) are connected electrically to two socket outlets 40, supported by base 26 and projecting inside socket 36. Contact studs 38 are similarly connected to two sockets 41 similar to sockets 40. The latter are connected to the terminals of a motor 31.

Figure 4:
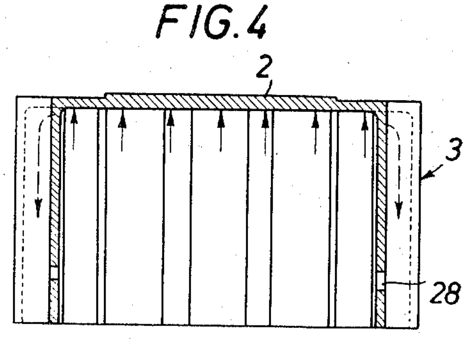
FIG. 4 shows, also as a vertical section, along line IV—IV of FIG. 2, the radiating component designed to cool the hot face of the thermo-element.
Figure 5:
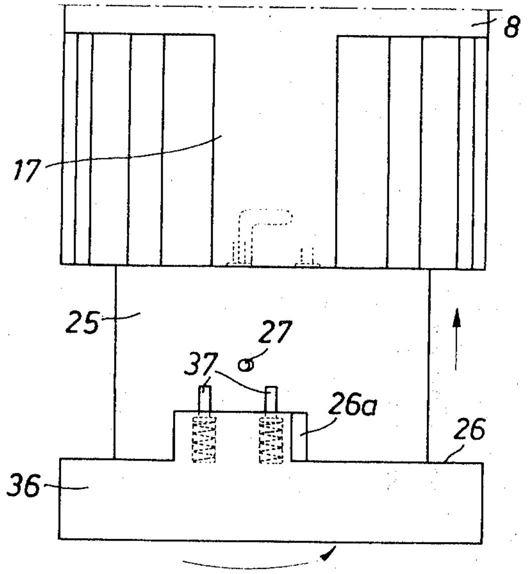
FIGS. 5 and 6 show, seen externally as a front view, the removable unit and a fraction of the other part of the apparatus, FIG. 5 showing them in position for assembly and FIG. 6 showing them, assembled into each other.
Figure 6:
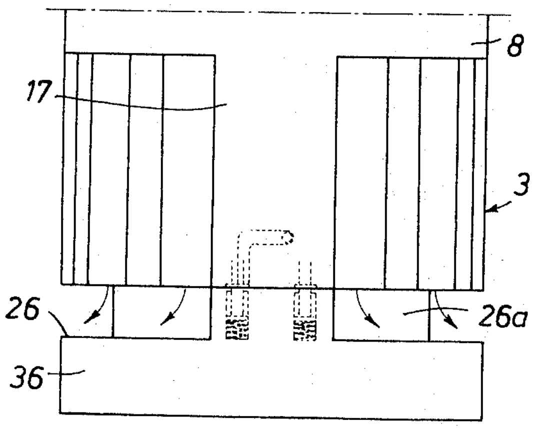

It is clear that as motor 31 rotates, a draft, as indicated by the arrows in FIGS. 1, 4 and 6, is sucked in by a wheel 33 through neck 35 and sent through sleeve 25 against the central part of bottom 2 of sleeve 3, perpendicular to the latter, this draft then flows radially between this bottom and the end part of sleeve 25, reaching the upper ends of the interior grooves 4 in sleeve 3, flowing therein and escaping therefrom outside of their lower ends (FIG. 4). When case 8 is removed, the ventilation unit is uncovered and can be used as a small ventilator.

In order to support the apparatus and feed it with electric current, various arrangements are used according to the intended uses of the apparatus. In FIG. 2, where it is to be used on an automobile, a supporting bracket 51 is provided to this effect, comprising a small plate 52 at the end of a hollow arm 53 sliding into a guide 54 attached to the dashboard 55 of an automobile. Plate 52 has a central hole pierced through it in which neck 35 is engaged. Furthermore, wires 57, 58 which supply the current and are connected to terminals 59 of a 12 volt battery, pass through the inside of hollow arm 53. Since motor 31 and thermo-element 1 operate on 6 volts, a resistance 60 is provided for voltage drops. A wire 61 leaves resistance 60 connected on wire 58, which leads to an external pin of a group comprising three pins arranged side by side and projecting onto plate 52 and which are to be capped by sockets 40 or sockets 41. Wires 57 and 58, respectively, lead to the two other pins, wire 57 leading to the middle pin 62. It can be seen, according to FIG. 3, that when the sockets 41 are set into the middle pin and to the one to which wire 58 leads, heating resistance 10 is in circuit and is fed under full voltage from the battery. In order to place the motor and thermo-element 1 in circuit, the apparatus is simply rotated by 180° around its axis, after having separated it from bracket 51, and it is then replaced on it: sockets 40 then cap the middle terminal 62 to which wire 57 leads and the one to which wire 61 leads. In the varying embodiment shown in FIGS. 7 and 8, the spatial arrangement of the main components (tubular body, thermo-element, motor member) has remained, on the whole, the same as in FIG. 1, but this varying embodiment comprises two main modifications, one of which relates to the thermal exchange surfaces for the cooling of the hot face of the thermo-element, and the other to the provision of the refrigerating compartment, which modifications, although incorporated herein simultaneously in the same apparatus may be used independently from each other. It can be seen in FIG. 7 that the thermal exchange surfaces comprise a plane plate 71 applied against the hot face of the thermo-element 72 through screws 73 and which overlap it substantially through an annular part bearing numerous flat, thin and long blades 74, arranged radially and on the parallel faces with respect to the axis of the apparatus. Slits 75, provided level with plate 71 in the wall of body 76 comprising a sleeve and which extend over the major part of its periphery provide for the passage of the cooling air from the hot face which is to circulate through the helix shaped rotating member 77.

With this arrangement, air circulation occurs radially not only against plate 71, as in FIG. 1, but also between the blades, where, however, the velocity of the air comprises, in addition, an axial component. This air circulation may be centripetal or centrifugal, depending on the way in which the rotating member or its direction of rotation is set up, although centripetal circulation gives better cooling.

Figure 9:
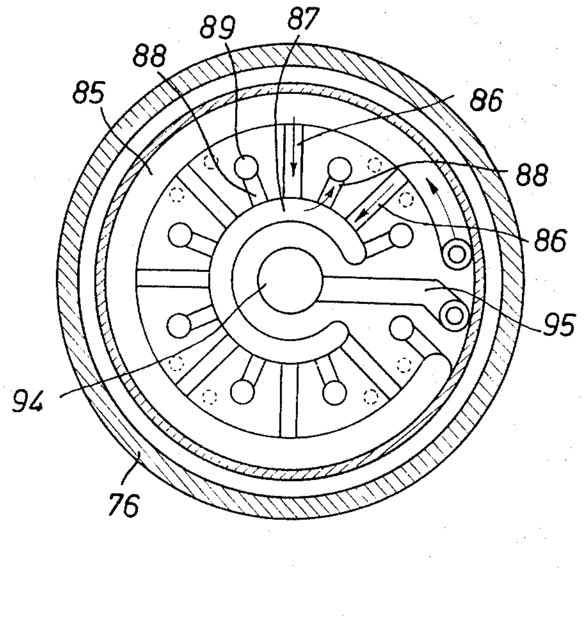
FIG. 9 is view similar to that of FIG. 8 after removal of the detachable plate inserted on the bottom of the tank.

The other modification which relates to means for using the cold face of the thermo-element in order to cool a liquid which is not contained in a container, comprises the addition of a cylindrical tank 78 slipped in and centered in sleeve 76, fastening screws 73 for plate 71 penetrating into the bottom of this tank in order to press it against the cold face of the thermo-element. A thermally insulating ring is interposed between this bottom and plate 71 around thermo-element 72 and an insulating ring is inserted between sleeve 76 and tank 78. In the latter, a pipe 81 emerges, through its bottom, which comes from the discharge of a small pump 82, of a known type, with flexible tubing 81, which is deformed in a cyclic manner by eccentric 83 wedged on the axis of motor 84 located at two ends of the shaft. The bottom of the tank has a peripheral groove 85 ploughed into it (FIG. 9) shaped as the arc of a circle at one end of which is located the end part of tube 81. Groove 85 communicates through radial channels 86, of which, in this case, there are 8, with a groove 87, also shaped as the arc of a circle, but closer to the center and the latter is itself in communication with the inside of the tank through radial channels 88 set between channels 86 and holes 89 perpendicular to the bottom of the tank and provided through a plate 91 pressed in a tight manner against the grooved face of the bottom through screws 92 which go through it; a central hole 93 of this plate places the inside of the tank in communication with a central cavity 94 provided in the bottom of the tank and itself in communication with a radial groove 95 with a hole 96 through the bottom of the tank, to which hole leads the other end of the flexible tube 81, i.e., the aspirating end. The liquid poured into the tank can thus, under the action of pump 82, circulate and cool itself in the closed circuit, consisting of tube 81, groove 85, radial channels 86, groove 87, radial channels 88, holes 89 and 93, central cavity 94, radial groove 95 and hole 96.

The upper part of the tank is closed by a plug shaped cover 97, with a toroidal joint, sliding into sleeve 76 and which can be operated with a central rod comprising a handle 99. In the tank, a cross-piece 100, of the usual type, may be housed, for the formation of ice cubes.

Figure 7:
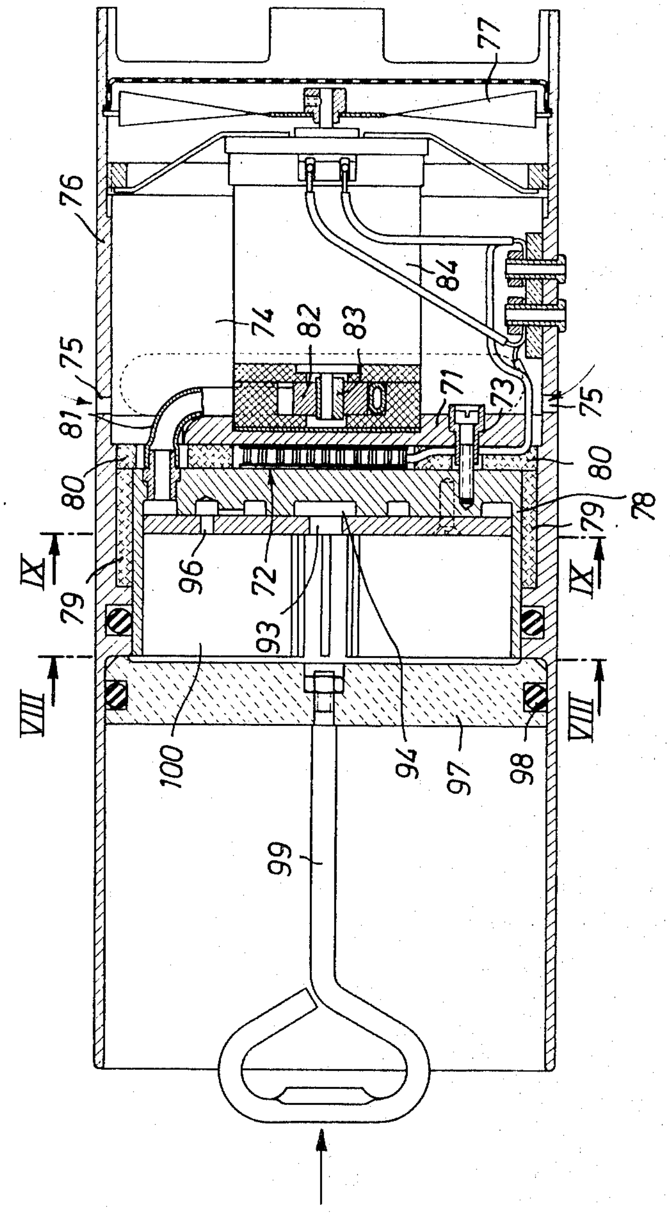
FIG. 7 shows, as a sectional view through the axis, both a varying embodiment of the refrigerating unit according to the invention and its use in order to constitute a cooling apparatus for a liquid which is not contained in a container.
Figure 8:
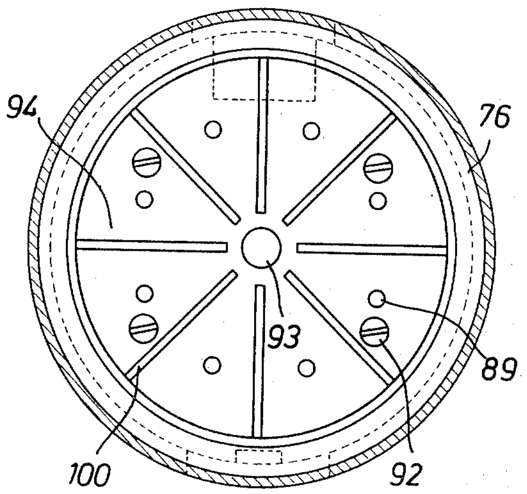
FIG. 8 is an end view, in the direction of arrow F. of the liquid tank with the cover removed, of the unit according to FIG. 7.
Figure 10:
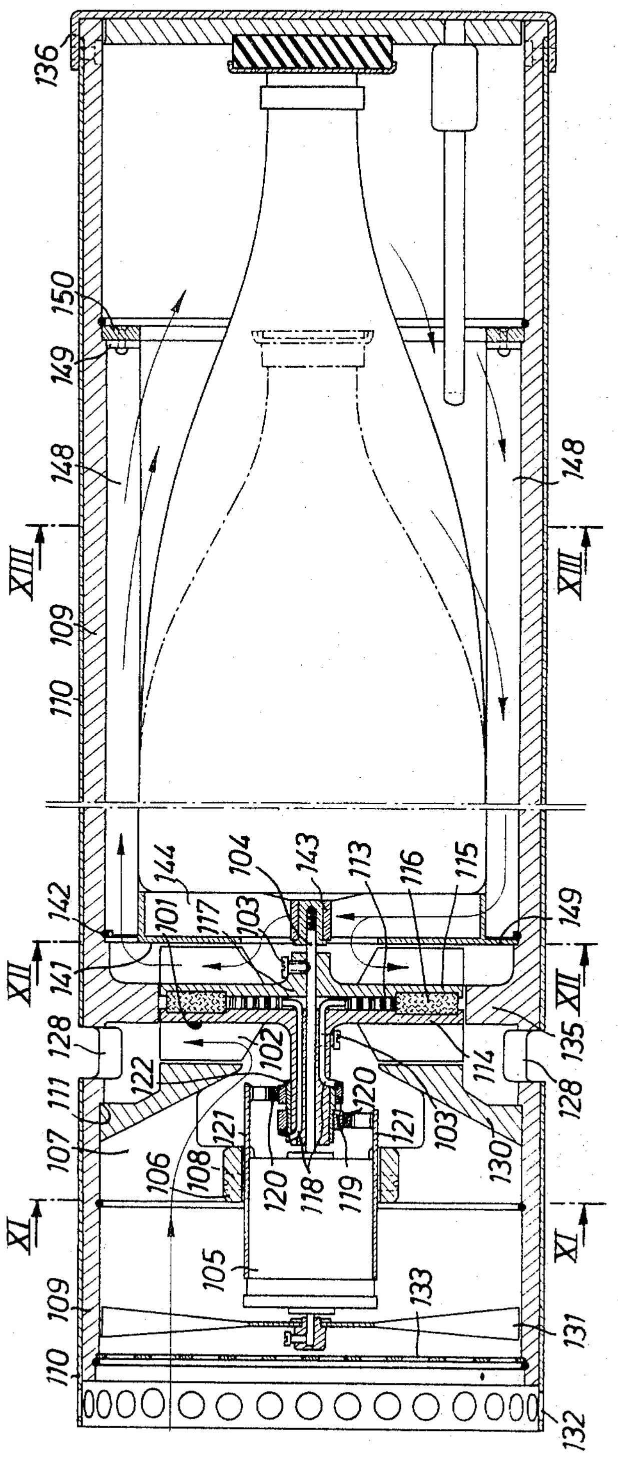
FIG. 10 is an axial section of another varying embodiment of the refrigerating unit and shows simultaneously its use to constitute a refrigerating apparatus which functions by circulating in a closed circuit, a thermal vehicle between the cold face of the thermo-electric component and whatever is to be cooled.

In the embodiment shown in FIG. 10, the spatial arrangement of the main components is the same as in FIG. 7, but an essential difference lies in the fact that the thermo-electric component 101 and thermal exchange surfaces 102 for the cooling of its hot face form a rotating arrangement fastened by two screws 103 onto shaft 104 of an electric motor 105 which is located at two ends of the shaft. The thermo-electric component 101 is annular and shaft 104 goes through it. Electric motor 105 is slipped into a sleeve 106 supported by cross-piece 107 and immobilized by two radial pressing screws 108. Cross-piece 107 is slipped into a socket 109 made of thermally insulating material comprising the internal coating of a tube 110 external to the body of the apparatus. Cross-piece 107 bears axially against a shoulder 111 of socket 109 and is maintained in place by a ring 112. The thermo-electric component 101 comprises ordinary thermo-electric couples 113 welded directly onto two plates or flanges 114 and 115 between which they form a flat crown or ring the diameter of which is less than that of flanges 114 and 115 between the overlapping parts of which is interposed a flat ring 116 made of thermally insulating material with respect to the opposite faces inserted into flat circular grooves, opposite one another, with respect to flanges 114 and 115. The latter carry, on the outside, central bosses 117 into which shaft 104 is adjusted and through which fastening screws 103 are radially inserted. Thermo-couples 113 are fed with electric current by wires 118 which arrive inside the ring which they form through holes crossing flange 114, these wires arriving from conducting rings 119 as they pass into longitudinal grooves of the boss 117 located on the side of the motor. The conducting rings 119 are in contact with carbons 120 supported by brushes 121 fastened onto motor 105, above an insulating socket, through screws 108 and electrically connected to the feeding wires, not shown, of the motor. Rings 119 are mounted on bearings having different diameters, of an insulating sleeve 122 inserted on boss 117.

Figures 14, 15:
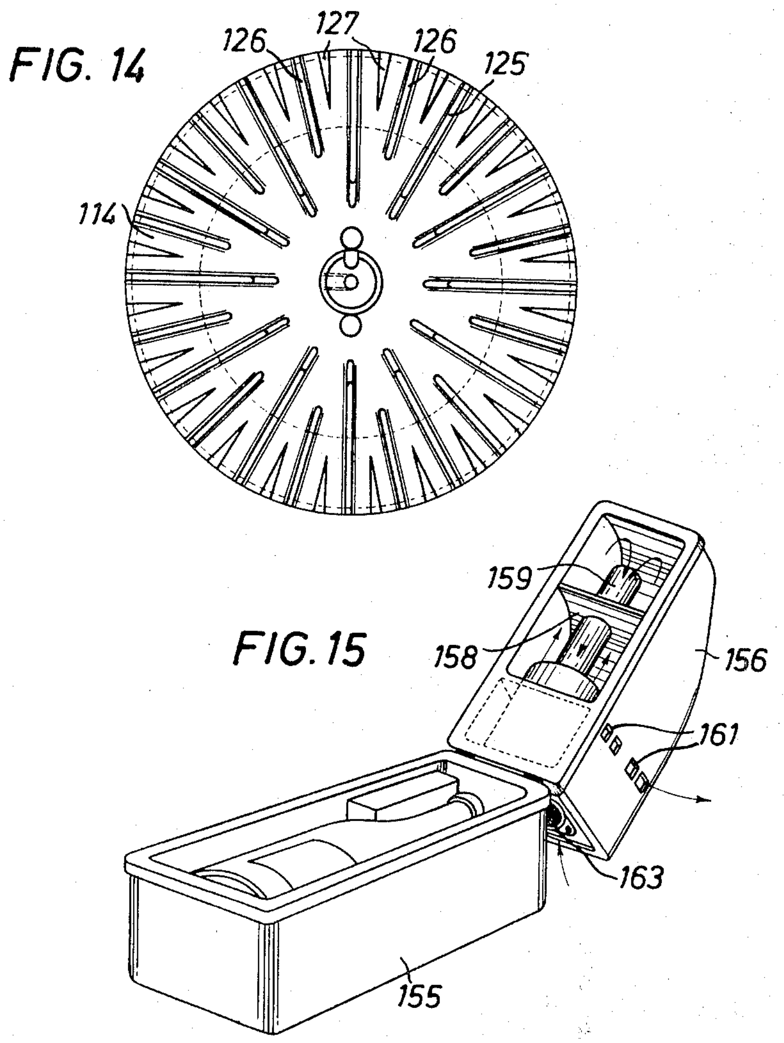
FIG. 14 is an end view of the hot face of the thermo-electric component.
FIGS. 15 and 16 are, respectively, a perspective view and front view of a refrigerating apparatus for bottles and other solid bodies, designed as an arm-rest for an automobile comprising a cold production unit according to the invention.
Figure 16:
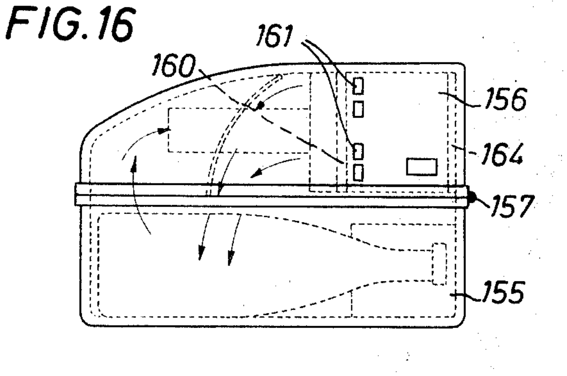

The plate, or flange, 114 of the thermo-electric component 101 comprises the hot face of the latter and supports a large number of thin blades 125, 126 and 127 arranged radially, as shown in FIG. 14, i.e., like blades or paddles on the flange of a ventilator wheel. However, these blades, in this case, are more numerous so as to increase the thermal exchange surface and, for the same purpose, blades 125 of great radial length alternate with blades 126 of lesser radial length from the periphery of flange 114 and, between each blade 125 and the next blade 126, is interposed a blade 127 which is still shorter. These blades 125 to 127, which, in this case, are radial, could be curved like the blades of a ventilator or turbine wheel. The unit thus formed constitutes a centrifugal ventilator wheel whose periphery is opposite apertures 128 in the insulating sleeve 109 and its external casing 110, while the central part forms an aspirating inlet and is located opposite an axial hole made in a wall 130 supported by the cross-piece 107 and shaped as a funnel converging towards this inlet so as to direct towards itself the air discharged towards the interior of the apparatus through helix 131, wedged on the second end of motor shaft 105, and aspirated by it through ports 132, provided in casing 110, at its end, and a filter 133 maintained against a shoulder of an insulating sleeve 109 through a ring.

It can be seen, that, in this embodiment, the hot face 114 of the thermo-electric component is cooled by an intense centrifugal draft generated by the cooling blades themselves 125 to 127 of its hot face driven into rotation, integral with the thermo-electric component 101, and forming a centrifugal ventilator wheel supercharged by helix 131 capable by itself of providing a high output under a low pressure and which, furthermore, discharges in this case on a depression due to the rotation of blades 125 to 127.

Figures 11, 12, 13:
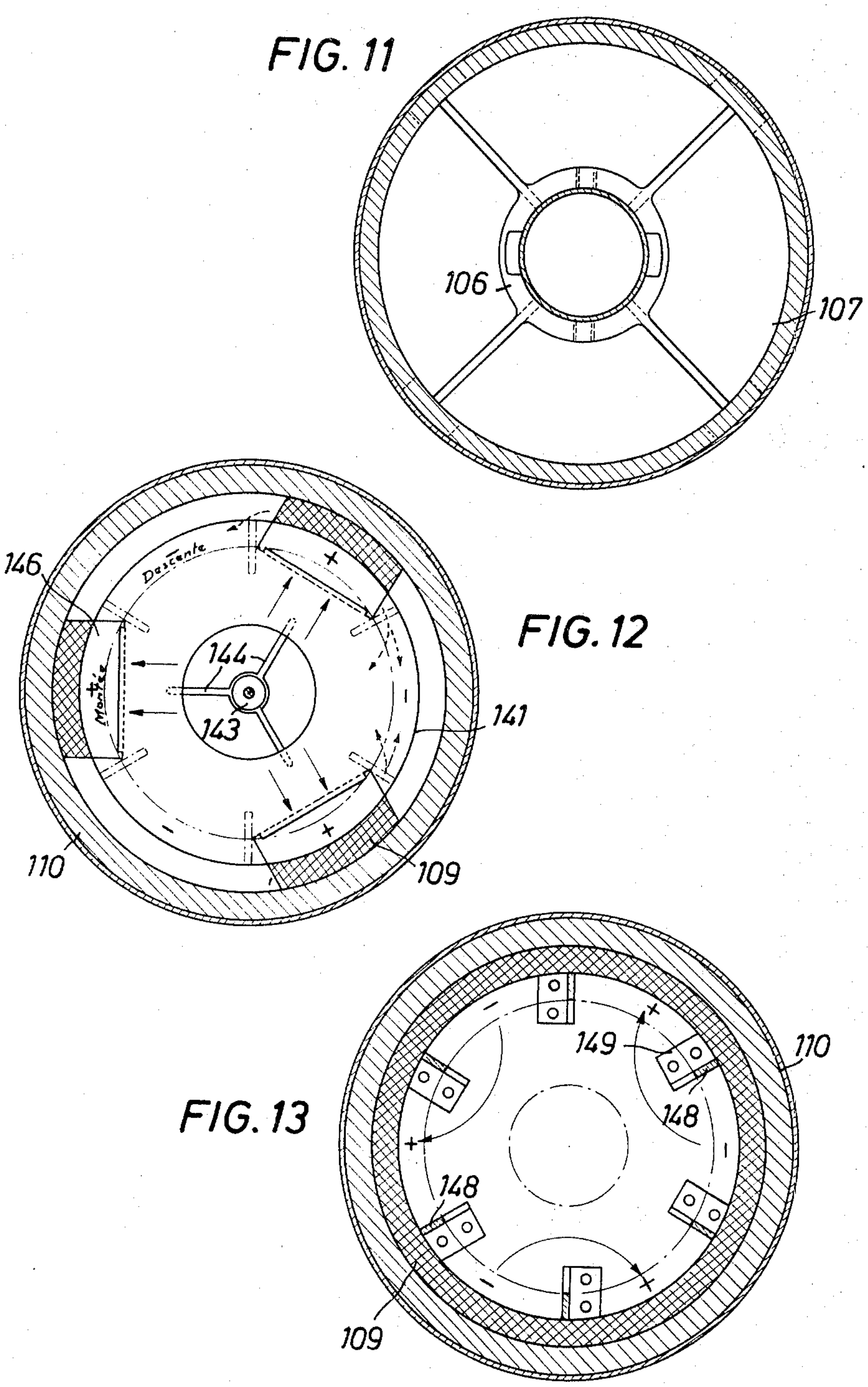
FIGS. 11, 12 and 13 are, respectively, cross-sectional views of it along lines XI—XI, XII—XII and XIII—XIII of FIG. 10.

The insulating sleeve 109 extends, as well as the external casing 110, beyond the rotating unit and has, at right angles to the thermo-electric component 101, a cross-wise partition 135 which surrounds the latter at its periphery. It is thus closed on the side of the cold face 115 of the thermo-electric component, a compartment open at the end and which can be closed with a cover 136 fitting through a bayonet with the open end of casing 110. In the closed compartment thus formed, is housed whatever is to be cooled, for example, a bottle; this is the conditioning compartment and the cold produced on the cold face 115 can be used by taking advantage of the rotation of the rotating unit. To this effect, the cold face 115 of the thermo-electric component is provided as a ventilator wheel by means of blades which are identical to blades 125, 126 and 127 of the hot face 114 and, in order to act as a fixed ventilator flange, a crosswise partition 141 is centered in the insulating sleeve 109 and is maintained against a shoulder of the latter through a ring 142. This partition 141 is provided centrally with a boss 143 which acts as a second bearing to shaft 104 of the motor and which is supported by radial arms 144 (FIG. 12) formed by ridges on this partition on the side opposite the blades. These ridges serve, in addition, as a support to the bottom of the bottle, or other container to be cooled. A central recess in this partition 141 provides around bearing 143, an annular inlet for the aspiration of air from the compartment through rotation of blades 125 to 127 of cold face 115 of thermo-electric component 101. In addition, three equally spaced notches 146 are provided at the periphery of partition 141 to permit the passage of the air discharged through rotation of the cold blades 125 to 127, into the conditioning compartment. In order to organize the circulation of air in this conditioning compartment, longitudinal partitions are provided in the annular space between sleeve 109 and the cylindrical container to be cooled, which is done by means of longitudinal radial partitions 148 (FIGS. 12 and 13) provided at their ends with curved lugs 149 through which they are attached by means of a screw, on the one hand, to partition 141, at the angles of notches 148 and, on the other hand, to an annular plate 150 sealing said annular space, at the end of these partitions other than that attached to partition 141.

The air centrifuged by blades 125 to 127 of the cold face 115 of the thermo-electric component 101 thus passes through notches 146, flows longitudinally in the sheath marked off by the two longitudinal partitions 148 which line the notches, leaves at the opposite end of these partitions and returns through the annular aspirating inlet at the center of partition 141 passing this time in the sheaths marked off by the two consecutive longitudinal partitions located at the angles of the two consecutive notches 146.

The air then circulates in a closed circuit inside the conditioning department, cools off against cold face 115 of the thermo-electric component 101 and the cold blades 125, 126 and 127 supported by this face, removes heat from the container to be cooled by circulating along and in contact with the latter in said sheaths marked off by the radial partitions 148 and returns against the cold face 115 to which it transfers this heat which it has carried.

The refrigerating unit described above may be used in various ways; FIGS. 15 to 19 give two examples of this. In the one shown in FIGS. 15 and 16, the refrigerating unit is housed inside a receptacle shaped so as to be usable as an arm-rest in an automobile. This receptacle comprises two parts 155, 156, hinged one to the other through a hinge 157; the lower part forms a tank so as to receive whatever is to be cooled, for example, a bottle. The upper part 156 is hollow as well and can act as a housing for a refrigerating set with a rotating unit of the type shown in FIG. 10 and it is closed hermetically on the lower part; its cavity and that of the tank 155 then both constitute the refrigerating compartment in which the air cooled by the set circulates. To this effect, the discharged air leaving notches 146 from plate 141 (FIG. 12) is deviated towards tank 155 by a crosswise deflecting partition 158 of the upper semi-compartment, which is thus subdivided into two subcompartments; in the other subcompartment, there exits a central tube 159 supported by plate 141 around its central orifice. A crosswise partition 160 in the cavity of the upper part 156 forms a joint on the body of the refrigerating set at right angles with the rotating unit and marks off, in this cavity, a third compartment in which the hot air driven away by the blades from the hot face of the thermo-electric component exits. This air then escapes to the outside through ports 161 in the wall of this subcompartment. Finally, the back face of this upper half 156 of the arm-rest is perforated and carries a filter 163 opposite helix 131 of the refrigerating set and a partition 164, similar to partition 160, also forms a joint on the periphery of this set between ports 161 and filter 163 through which the refrigerating set aspirates the cooling air from the hot face of the thermo-electric component.

Figure 17:
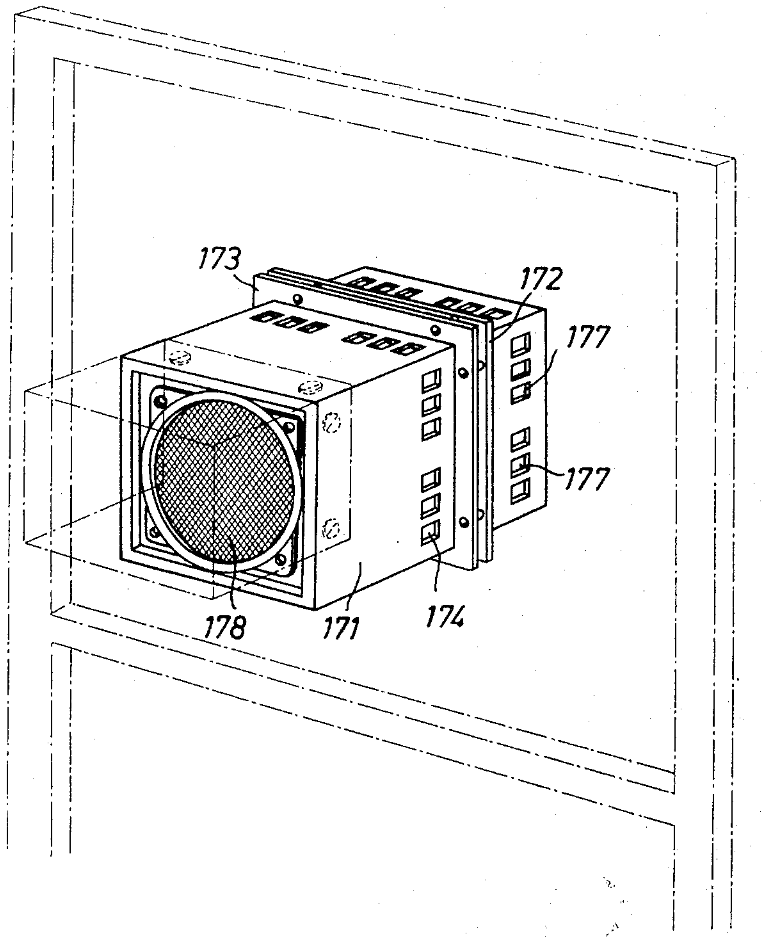
FIGS. 17, 18 and 19 are, respectively, perspective, front and end views of an air-conditioner provided with a refrigerating unit according to the invention.
Figure 18:
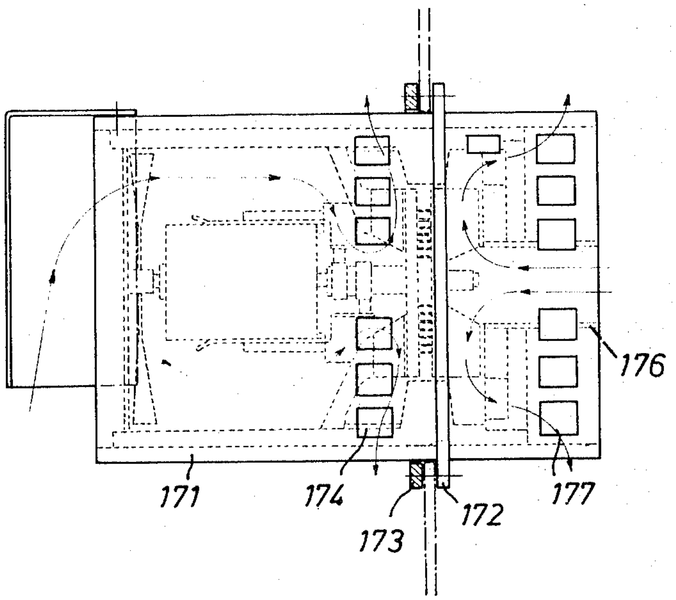
Figure 19:
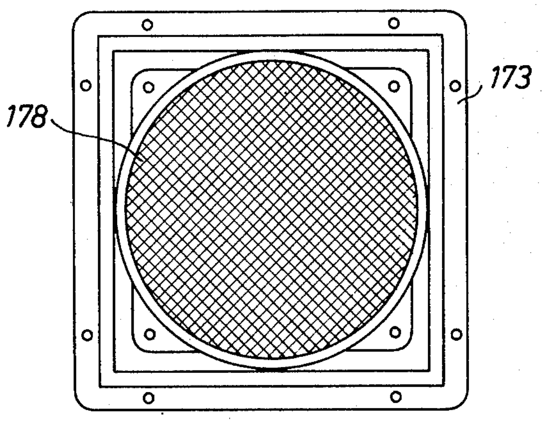

In the example of a practical use shown in FIGS. 17 to 19, a refrigerating set with a rotating unit, of the type shown in FIG. 10, is enclosed in a case so as to constitute an air-conditioning unit. This case consists of a body 171 housed in the opening of a window pane or a wall and is provided with a flange 172 and a counterflange 173 designed to attach it to the edges of this opening, and this body has, at right angles with windows 128 of the body of the unit (FIG. 10), ports 174 crossing the wall of body 171 so as to allow the exit of hot air driven through windows 128 by blades 125 to 127 of the hot face of the thermo-electric component. Flange 173 is located in such a way on body 171 that when the air-conditioning unit is set into place, these ports are located outside the place to be air-conditioned.

The arrangement of the air conditioning compartment is simplified with respect to FIG. 10. It no longer has internal partitioning in order to cause the circulation of the air to be cooled but has only a central tube 176 similar to tube 159 of FIG. 15, i.e., a tube supported by a plate 141 (FIG. 10) around its central air aspiration hole and which extends up to the end of that part of body 171 located in the place to be air-conditioned. Ports 177 provided in the wall of this part of the body all around it provides for the communication of the place to be air-conditioned with the space surrounding tube 176 inside this part which is sealed at the end around this tube 176. The air is thus sucked in the place to be air-conditioned, passes through tube 176, cools off on blades 125 to 127 of the cold face of the thermo-electric component and returns in the place through ports 177. As far as the cooling air of the hot face of the thermo-electric component is concerned, it is sucked to the outside, through the end face, which is pierced and provided with a grid 178, by the refrigerating set, and returns to the outside through ports 174.

What I claim is:

1. A device for cold production comprising a Peltier effect thermoelectric component having two faces, thermal exchange blade means comprising blades arranged edgewise and radially against said two faces and propulsion means to cause the circulation of air through the thermal exchange means over said two faces of said thermoelectric component, said thermoelectric component being mounted in a casing, said casing defining a funnel having an asperating outlet adjacent the interior area one of said two faces of said thermal exchange means, said casing including apertures adjacent the periphery of said thermal exchange means, said propulsion means rotatably driving said thermal exchange means to draw fluid flow across said thermoelectric element, a partition being mounted crosswise in said casing and supported adjacent the other of said two faces of said thermoelectric element, said partition defining in cooperation with said casing a conditioning compartment for an article to be cooled and including a central recess for the inlet of air from said compartment to the thermal exchange means on said other face of said thermoelectric component, and notches at the periphery of said partition for the discharge of air by said thermal exchange means to said compartment.

2. A device according to claim 1 comprising longitudinal partitions in said compartment adjacent the interior wall of said casing defining vertical sheaths, alternate ones of said sheaths being in fluid flow communication with said notches whereby fluid flow circulation paths from said notches through said sheaths to said recess are defined.

3. A device for cold production comprising a Peltier effect thermoelectric component having two faces, thermal exchange blade means comprising blades arranged edgewise and radially against said two faces and propulsion means to cause the circulation of air through the thermal exchange means over said two faces of said thermoelectric component, said radially arranged blades comprising a first plurality of blades of great radial length extending from the periphery of said thermoelectric element toward the interior thereof, a second plurality of blades of lesser radial length alternating with said blades of great radial length, and a third plurality of blades least radial length alternating with each of said first and second blades.

4. A device as claimed in claim 3 wherein said blades are curved.

5. A device as claimed in claim 1 wherein said radially arranged blades comprise a first plurality of blades of substantial radial length extending from the periphery of said thermoelectric element toward the interior thereof, a second plurality of blades of lesser radial length alternating with said blades of substantial radial length, and a third plurality of blades of least radial length alternating with each of said first and second blades.

6. A device as claimed in claim 5 wherein said blades are curved.

7. A device as claimed in claim 1 wherein said thermoelectric component, thermal exchange and propulsion means for fluid flow are located in one portion of said separable two-piece casing and substantially axially aligned parallel to the line of separation between said first and second pieces thereof, the second piece of said casing defining a compartment for holding an article to be cooled, deflection plate means for deflecting the fluid flow from one of said faces of said thermoelectric element into the second piece of said casing, and a central tube passing through said deflection plate means for defining an air return duct from said second piece of said casing to said one face of said thermoelectric element.

8. A device as claimed in claim 7, wherein said deflection plate means comprises a plate having a portion substantially perpendicular to the direction of fluid flow away from said one face of said thermoelectric element.

* * * * *